United States Patent [19]

Pham

[11] Patent Number: 4,626,714
[45] Date of Patent: Dec. 2, 1986

[54] CIRCUIT FOR LIMITING THE DEVIATION OF LOGIC VOLTAGES

[75] Inventor: Ngu T. Pham, Paris, France

[73] Assignee: Thomson-CSF, Paris, France

[21] Appl. No.: 803,166

[22] Filed: Dec. 2, 1985

[30] Foreign Application Priority Data

Dec. 4, 1984 [FR] France .................. 84 18467

[51] Int. Cl.$^4$ ............................................. H03K 5/08
[52] U.S. Cl. ..................................... 307/550; 307/552; 307/560; 307/564; 307/363
[58] Field of Search ............... 307/443, 446, 448, 540, 307/549–550, 552, 560, 564, 363

[56] References Cited

U.S. PATENT DOCUMENTS 3,518,449  6/1970  Chung .................................. 307/454
3,987,310 10/1976  Peltier et al. ....................... 307/458

FOREIGN PATENT DOCUMENTS 2290096  5/1976  France .

OTHER PUBLICATIONS

Patents Abstracts of Japan, vol. 7, No. 247, (E208) (1392) Nov. 2, 1983; & JP-A-58 136 139 (Nippon Denki K.K.) 13-08-83.
Patent Abstracts of Japan, vol. 1, No. 58, Jun. 6, 1977, p. 67 E 77; & JP-A-52 2270 (Hitachi Seisakusho K.K.) 08-01-1977.
Patents Abstracts of Japan, vol. 5, No. 86, (E-60) (758) Jun. 5, 1981; & JP-A-56 34 235 (Nippon Denki K.K.) 06-04-1981.
E.D.N. Electrical Design News, vol. 39, No. Jun. 3, 1984, pp. 225-232, Boston Mass., US; J Haight: "GaAs Logic Characteristics Result in Integration Problems."

Primary Examiner—Stanley D. Miller
Assistant Examiner—Margaret R. Wambach
Attorney, Agent, or Firm—Oblon, Fisher, Spivak, McClelland & Maier

[57] ABSTRACT

A circuit is provided for limiting logic voltage deviations in so called very low consumption and ultra high speed DCFL logic circuits. The limiter circuit comprises, mounted in series between a voltage source and ground, a resistor and a normally off field effect transistor. The source of the transistor is grounded. The gate is connected to the drain which forms the output of the limiter circuit. The output voltage, which forms the high logic level, is less than or equal to three times the threshold voltage of the transistor if the current which flows through the load is less than or equal to twice the product of the transconductance of the transistor multiplied by its threshold voltage.

5 Claims, 4 Drawing Figures

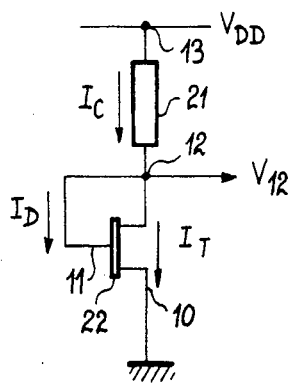
FIG_1
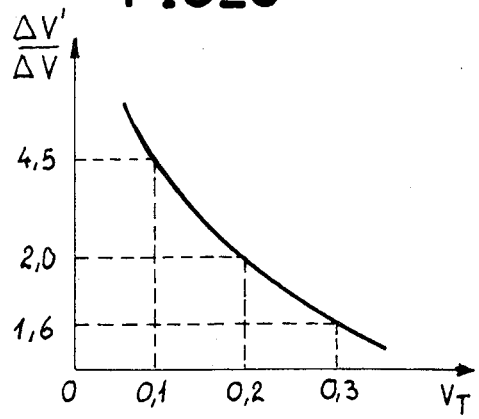
FIG_3
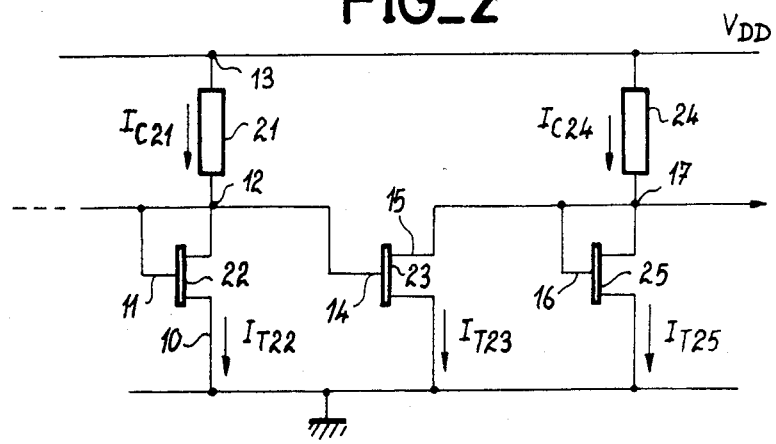
FIG_2
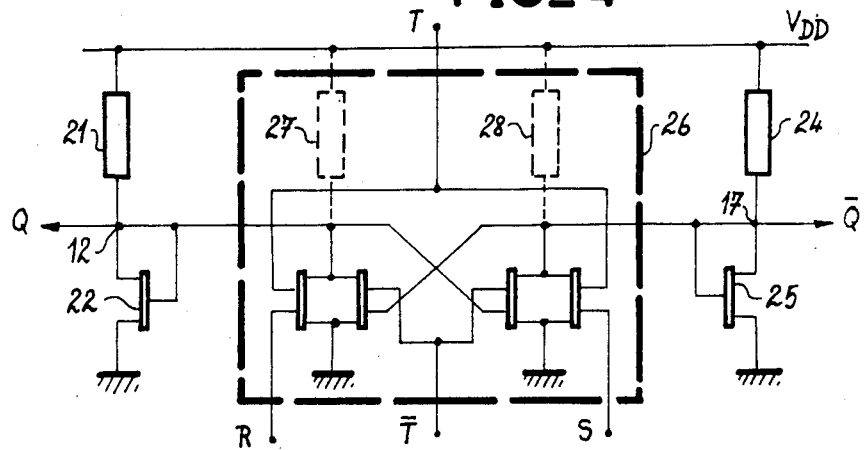
FIG_4

CIRCUIT FOR LIMITING THE DEVIATION OF LOGIC VOLTAGES

BACKGROUND OF THE INVENTION

The present invention relates to a voltage limiter for very low consumption and ultra high speed logic circuits, the voltage limitation considered concerning the voltage deviation between the low and high levels, or logic 0 and 1.

The voltage limiting circuit of the invention relates more particularly to directly coupled field effect transistor logic circuits, called DCFL or "Direct Coupled FET Logic", formed with normally off transistors, whose threshold voltage is positive. The voltage limiting circuit is formed by a field effect transistor, of normally off type, whose gate is connected to the drain, and which is fed through a resistor connected to the drain.

DCFL logic circuits perform better with an increase in the load current through the resistor which feeds the transistor, but in this case the resistance of the transistor in the enabled condition increases. In order to ensure correct operation of the logic circuit it is preferable to choose a smaller load current and to compensate for the loss of speed which results therefrom by a reduction of the switching time of the logic circuit by reducing the voltage deviation between the low and high logic levels.

Such limitation of the voltage deviation is obtained by a single field effect transistor, fed by its drain through a load resistor and whose gate is connected to the drain, this transistor and its load resistor being of the same type and of the same characteristics as the transistors and their load forming the controlled logic circuit.

SUMMARY OF THE INVENTION

More precisely, the invention provides a circuit for limiting the deviation of the logic voltages in direct coupled logic circuits, called DCFL, characterized in that it comprises, connected in series between a power supply source and ground, a load resistor and a field effect transistor whose source is grounded and whose gate is connected to the drain, which forms the output of the limiter circuit, the voltage of the common point between the load and the drain of the transistor being limited if the resistor is matched to the transconductance and to the threshold voltage of the transistor, so that the current which flows through the load resistor is less than or equal to twice the product of the transconductance multiplied by the threshold voltage:

$$I_{C21} \leq 2 g m_{22} \cdot V_T$$

BRIEF DESCRIPTION OF THE DRAWINGS

The invention will be better understood from a description of its operation, one example of its application. These descriptions refer to the accompanying drawings wherein:

FIG. 1: the circuit diagram of the voltage limiting device of the invention;

FIG. 2: the circuit diagram of the voltage limiting device coupled to a logic inverter;

FIG. 3: a curve of the voltage deviation ratios, with and without limiter, as a function of the threshold voltage of the transistor; and FIG. 4: diagram of a $\overline{RST\overline{T}}$ flip flop, having two voltage limiters in accordance with the invention.

DESCRIPTION OF THE PREFERRED EMBODIMENTS

So called DCFL logic circuits comprise only one field effect transistor fed from a voltage $V_{DD}$ through a load resistor. In this type of logic, the transistor is necessarily normally off, with positive threshold voltage. The gate of the transistor forms the input and the common point to the drain and to the load resistor form the output of the cirucit.

It is known that the performances of conventional DCFL logic circuits depend essentially—for a given type of transistor—on the current $I_C$ in the load: the higher the current, the higher the operating speed of the logic circuit.

But the current $I_C$ is limited by the condition of compatibility $$V_B = R_{on} \cdot I_C \leq V_T$$

in which:
$V_B$=logic low level, also called "residue" voltage,
$R_{on}$=resistance of the transistor in the "on" state,
$V_T$=threshold voltage of the transistor.

In order that a logic flip flop having a normally off transistor may operate, it is obvious that the logic low level $V_B$ must be less than the threshold voltage $V_T$ which enables the transistor.

In order to increase the load current $I_C$—which increases the speed of the logic cirucit—the threshold voltage $V_T$ may be increased, which can be done during manufacture of the transistor, for example using a smaller channel thickness under the gate. But the resistance $R_{on}$ increases when the threshold voltage $V_T$ increases, which leads to contradictory conditions.

It is preferable to choose a load current $I_C$ which is lower than its optimization value, namely the one which communicates the highest speed to the DCFL circuit. Thus, the voltage $V_B$ of the logic low level remains lower than the threshold voltage $V_T$ and, if it is not required to choose a high threshold voltage, for technological reasons for example, the resistance $R_{on}$ may be very small. The advantage is that the efficiency in manufacturing integrated circuits with low threshold voltage $V_T$ and low load current $I_C$ is much better.

The loss of speed admitted, because of a low load current, is compensated for by a gain in the switching time. The switching time $T_{pd}$ of a DCFL circuit is, in the first order, given by the approximation $$T_{pd} \approx (C \cdot \Delta V)/I_C$$

in which:
$C$=capacity of the load of the transistor,
$\Delta V = V_H - V_B$=deviation of the high ($V_H$) and low ($V_B$) logic level voltages,
$I_C$=load current.

In conventional DCFL circuits:

$$V_H \approx V_D \approx 1 \text{ volt}$$

$V_D$ being the threshold voltage of the Schottky diode which forms a transistor gate.

If the load current $I_C$ must be small, the loss of speed of the DCFL circuit may be compensated for by a reduction in the switching time $t_{pd}$ by reducing the voltage deviation $\Delta V$.

The invention provides then a circuit which limits the voltage deviation of the logic levels, shown in FIG. 1.

The voltage limiting circuit of the invention comprises a load 21 connected in series with a transistor 22. Load 21 is either a linear resistor, obtained for example by metal deposition or implantation, at the surface of the integrated circuit chip, or a saturable load such as a gateless field effect transistor. The transistor 22 has a Schottky gate and is normally off, the gate 11 of the transistor is connected to the drain, at a point 12 and the source 10 of the transistor is connected to the ground of the circuit. The load resistor 21 is connected between the drain 12 and a point 13 of a power supply $V_{DD}$.

The current $I_{C21}$ which flows through the load resistor 21 is divided into a current $I_{T22}$ which flows through a transistor 22 and a current $I_D$ which flows through the Schottky diode of gate 11 and may be written as:

$$I_{T22} = g_{m22}(V_{12} - V_T) \quad \text{Equation 1}$$

where:

$g_{m22} \approx 1/R_{on}$ = transconductance of the transistor 22
$V_{12}$ = drain-source voltage of the transistor,
$V_T$ = threshold voltage of the transistor.

If the voltage $V_{12}$ at the drain is less than or equal to the threshold voltage $V_D$ of the Schottky gate diode $$V_{12} \leq V_D \quad \text{Equation 2}$$

but is however greater than the threshold voltage $V_T$ of the transistor, there is then no current $I_D$ flowing through gate 11

$$I_D = 0 \quad \text{Equation 3}$$

and in this case the current $I_{T22}$ which flows through transistor 22 is equal to the current $I_{C21}$ which flows through the load 21

$$I_{T22} = I_{C21} = g_{m22}(V_{12} - V_t) \quad \text{Equation 4}$$

from which we derive:

$$V_{12} = (I_{C21}/g_{m22}) + V_T \quad \text{Equation 5}$$

The voltage $V_{12}$ at the drain, which remains less than or equal to the voltage $V_D$ (equation 2) will be all the smaller the lower the load current $I_{C21}$.

Let us now consider, in FIG. 2, a logic inverter formed by a transistor 23, whose source is grounded. Gate 14 of this transistor 23 is connected to the drain 12 of the transistor 22 of a first limiter circuit of FIG. 1: the gate 14 receives therefore the voltage $V_{12}$. The drain 15 of transistor 23 is connected to the drain 17 of a tansistor 25 of a second limiter circuit shown in FIG. 1.

Since the three transistors 22, 23 and 25 are integrated simultaneously, as well as the load resistors 21 and 24 of the first and second limiter circuits, it is prescribed that the transistors have the same threshold voltage and that the load resistors are identical. If the circuit is not integrated but made from discrete elements, this condition remains valid.

With the potential $V_{12}$ applied to the gate 14 of transistor 23, the current $I_{T23}$ in this transistor is:

$$I_{T23} = g_{m23}(V_{12} - V_T) \quad \text{Equation 6}$$

since the threshold voltage $V_T$ is the same for transistors 22, 23 and 24.

From relationship 4, we may write:

$$V_{12} - V_T = I_{C21}/g_{m22} = I_{T23}/g_{m23}$$

or else $$I_{T23}/I_{C21} = g_{m23}/g_{m22} = g_{m23}/g_{m25} = I_{T23}/I_{C24} \quad \text{Equation 7}$$

since transistors 22 and 25 are identical and the load resistors 21 and 24 are identical.

So that the load resistor 24 of the second limiter circuit is compatible with the transistor 23—which it completes so as to form an inverter—the following condition is prescribed;

$$I_{T23max}/I_{C24} = g_{m23}/g_{m25} \geq 2 \quad \text{Equation 8}$$

This condition may be read as follows: it is prescribed that, under the operating conditions of the invention, the current $I_{C24}$ in the load resistor 24 be always less than or equal to half the saturation current $I_{T23}$ in transistor 23.

In this case, the residue voltage or logic low level voltage $V_B$ of transistor 23, loaded by resistor 24, is then $$V_B = R_{on23} \cdot I_{C23} \approx (1/g_{m23}) \cdot I_{C24} \quad \text{Equation 9}$$

but from the relationship 6
$$1/g_{m23} = (V_{12} - V_T)/I_{T23}$$

so $$V_B \approx (I_{C24}/I_{T23})(V_{12} - V_t)$$

Since it is prescribed $$I_{T23max}/I_{C24} \geq 2 \text{ this is } I_{C24}/I_{T23max} \leq \tfrac{1}{2}$$

it follows that $$V_B \leq \tfrac{1}{2}(V_{12} - V_T)$$

The conditions $V_B \leq V_T$ of compatibility of the logic levels becomes $$(V_{12} - V_T)/2 \leq V_T \text{ that is } V_{12} \leq 3V_T \quad \text{Equation 11}$$

This condition is readily satisfied by choosing the current $I_{C24}$ fairly small. From equation 5, and because the transistors 22 and 25 and the loads 21 and 24 are identical, respectively $$V_{12} = (I_{C24}/g_{m25}) + V_T \leq 3V_T$$

$$I_{C24} \leq 2g_{m25}V_T \quad \text{Equation 12}$$

i.e., because the condition of equation of condition 8

$$I_{C24} \leq g_{m23}V_T \quad \text{Equation 13}$$

the borderline case of a logic circuit having the voltage deviation limiter is $V_B = V_t$
namely $$V_{12} = 3V_T$$

and the deviation $\Delta V$ of the logic level voltages is $$\Delta V = V_H - V_B = V_{12} - V_B = 2V_T$$

If we compare this result with that of a known logic circuit, not having a voltage deviation limiter, and in which $$V_B = V_T$$

and $$V_H = V_D$$

the voltage deviation is $$\Delta V = V_D - V_T$$

The ratio of the voltage deviations, with and without limiter, is $$\Delta V'/\Delta V = (V_D - V_T)/2V_T$$

FIG. 3 shows the curve of this ratio of the voltage deviations, by taking, by way of application, $V_D = 1$ volt. When the threshold voltage $V_T$ of a transistor varies from $+0.1$ volt to $+0.3$ volt, the ratio $\Delta V'/\Delta V$ varies from 4.5 to 1.6. This curve and these results show that the voltage deviation limiter of the invention is particularly advantageous for transistors having a threshold voltage $V_T$ positive and close to 0 volt.

DCFL logic circuits equipped with a voltage deviation limiter of the invention have performances which are much higher than those which are not so equipped. In fact, for a transistor 23 forming part of a logic circuit, the rise time $t_r$ is given by $$t_r = (C \cdot \Delta V)/-I_{C24}$$

the fall time $t_f$ is given by $$t_f = (C \cdot \Delta V)/(I_{T23max} - I_{C24})$$

and the switching time $t_{pd} = t_r + t_f$ is proportional to $$t_{pd} = (C \cdot \Delta V)/(I_{T23max} - I_{C24})$$

This switching time is decreased by a decrease in the value of $\Delta V$.

The case which has just been described corresponds to the border line case where $$I_{C24} = g_{m23} \cdot V_T \qquad \text{Equation 13}$$

If we choose a load current smaller than the limit values, i.e.

$$I_{C24} < g_{m23} \cdot V_T$$

the ratio $\Delta V'/\Delta V$ is even greater, which compensates for the reduction in performance related to a low load current.

Thus, limitation of the logic voltage deviations allows DCFL circuits to be obtained having very interesting performances, with much less technological constraints than those which are known for increasing the speed of conventional DCFL circuits.

The construction of synchronizable DCFL flip flops is one of the most interesting applications of the voltage deviation limiter of the invention.

It is known that the use of dual gate transistors allow RST$\overline{\text{T}}$ flip flops to be formed which are the most rapid among all the synchronizable flip flops. RST$\overline{\text{T}}$ flip flops are RST flip flops operating with two clocks which supply the signals T and $\overline{\text{T}}$: they are also called AND-NOR flip flops in the USA.

Because of the higher resistance of the two series gates in a dual gate transistor, for a given supply voltage $V_{DD}$, the resistance $R_{on}$ of the transistor in the "on" state is substantially twice the $R_{on}$ of a monogate transistor, and the load current $I_C$ must be substantially half that which flows through a monogate transistor: this reduces the performances of DCFL circuits with dual gate transistors.

This reduction of the load currents is compensated for, with the deviation limiter of the invention, by the reduction of the logic deviation, which reduces, as was seen, the switching time and so increases the speed of the logic circuit.

FIG. 4 shows and RST$\overline{\text{T}}$ flip flop having voltage deviation limiters in accordance with the invention. In this Figure, the broken line rectangle 26 encloses a conventional RST$\overline{\text{T}}$ flip flop, except for one detail: if this flip flop were not provided with two limiters in accordance with the invention, the transistors which form it would be supplied from a voltage $V_{DD}$ through two resistors 27 and 28 which are shown with broken lines.

This flip flop has two inputs R and S (Reset and Set), two outputs Q and $\overline{\text{Q}}$, and it is controlled by two clocks T and $\overline{\text{T}}$. At its two outputs Q and $\overline{\text{Q}}$ are coupled two voltage deviation limiter circuits of the invention. At the output Q is connected a first limiter formed by a load resistor 21 and a transistor 22, connected so that the common point 12 between resistor 21 and transistor 22, at which there exists a voltage which was called above $V_{12}$, merges with the output Q of the flip flop. Similarly, at the output $\overline{\text{Q}}$ is connected a second limiter, formed by a resistor 24 and a transistor 25, and the common point 17 merges with the output $\overline{\text{Q}}$ of the flip flop.

Resistors 21 and 24 replace, respectively, the supply resistors 27 and 28 of the flip flop of the known art.

Because the outputs Q and $\overline{\text{Q}}$ are connected to points 12 and 17, the output levels are limited for the same reason as the voltage $V_{12}$ (or $V_{17}$) is limited. The levels of outputs Q and $\overline{\text{Q}}$ are compatible with the levels of input R and S:

$$V_{QH} \leq 3V_T$$

$$V_{QB} \leq V_T$$

that is to say that such RST$\overline{\text{T}}$ flip flop may be connected in cascade, however the clock signals T and $\overline{\text{T}}$ have normal levels.

From the point of view of construction of such a flip flop, or of any other logic circuit having at least one voltage deviation limiter, it is sufficient to add the two transistors 22 and 25, connected to the outputs Q and $\overline{\text{Q}}$ and to calculate the load resistors 21 and 24—or 27 and 28 of an existing flip flop, which amounts to the same thing - and the characteristics of the transistors, in particular their transconductance $g_m$ and their threshold voltage $V_T$ so that they fulfill the condition:

$$I_{C24} \leq 2g_{m25}V_T$$

equivalent to $$I_{C21} \leq 2g_{m22}V_T$$

which causes the limitation of logic voltage deviations:

$$V_{QH} \leq 3T$$

$$V_{QB} \leq V_{VT}$$

The embodiments relate to all logic circuits, but more particularly to those in which a high speed is desired, namely logic integrated circuits on GaAs or materials III-V.

What is claimed is:

1. A circuit for limiting the deviation of logic voltages in direct coupled logic circuits, called DCFL, comprising, connected in series between a supply source and ground, a load impedance and a field effect transistor whose source is grounded and whose gate is connected to the drain, which forms the output of the limiter circuit, the voltage of the common point between said load impedance and the drain of said field effect transistor being limited if said load impedance is matched to the transconductance and to the threshold voltage of said field effect transistor, so that the current which flows through the load resistor ($I_{C21}$) is less than or equal to twice the product of the transconductance ($g_{m22}$) multiplied by the threshold voltage ($V_T$):

$$I_{C21} \leq 2g_{m22} \cdot V_T$$

2. The voltage deviation limiter circuit as claimed in claim 1, wherein said field effect transistor is a transistor of normally off type with low positive threshold voltage.

3. The voltage deviation limiter circuit as claimed in claim 1, wherein said load impedance is a linear resistor or a saturable load.

4. The voltage deviation limiter circuit as claimed in claim 1, wherein, with the low logic level less than or equal to the threshold voltage ($V_T$) of said field effect transistor (condition of compatibility between logic circuits), the high logic level ($V_H = V_{12}$) is less than or equal to three times the threshold voltage:

$$V_H \leq 3v_T$$

5. A direct coupled logic circuit, of DCFL type, comprising, at at least one of its outputs, at least one voltage deviation limiter circuit as claimed in any one of claims 1 to 4.

* * * * *